United States Patent [19]

Bovino

[11] Patent Number: 4,633,286

[45] Date of Patent: Dec. 30, 1986

[54] MULTIPLE GAP OPTICALLY ACTIVATED SWITCH

[75] Inventor: Lawrence J. Bovino, Eatontown, N.J.

[73] Assignee: The United States of America as represented by the Secretary of the Army, Washington, D.C.

[21] Appl. No.: 596,966

[22] Filed: Apr. 5, 1984

[51] Int. Cl.$^4$ .................................. H01L 27/14
[52] U.S. Cl. .................................. 357/30; 357/3
[58] Field of Search .............. 357/30, 3, 19; 307/311, 307/248; 250/211 J

[56] References Cited

U.S. PATENT DOCUMENTS 3,797,831 10/1972 Anderson et al. .................. 357/3
4,376,285 3/1983 Leonberger et al. ................ 357/30

Primary Examiner—James W. Davie
Assistant Examiner—Georgia Y. Epps
Attorney, Agent, or Firm—Sheldon Kanars; Jeremiah G. Murray; Paul A. Fattibene

[57] ABSTRACT

Solid state optically activated switches in which a plurality of spaced contacts are arranged in a line on one of the broad surfaces of a semiconductor wafer and one or more bridging electrodes are arranged on the opposite broad surface thereof. The two end contacts are the switch terminals. This arrangement directs the electric field and the load current into the bulk of the semiconductor in a zig-zag fashion to provide a high hold-off voltage and a short conduction path. Also the bridging electrode can be used as a control electrode. A novel circuit utilizing such switches is shown.

8 Claims, 5 Drawing Figures

MULTIPLE GAP OPTICALLY ACTIVATED SWITCH

The invention described herein may be manufactured, used and licensed by or for the Government for governmental purposes without the payment to me of any royalties thereon.

BACKGROUND OF THE INVENTION

In recent years the solid state optically activated switch has received increasing attention because of its advantages in kilovolt pulser circuits. This interest stems from several unique properties of these switches not found in prior art switches used in pulser circuits. These optical switches comprise a bulk semiconductor usually of rectangular shape and can be intrinsic or doped. Since the semiconductor does not involve any p-n junctions, they can be scaled up in size to increase power handling capacity. A pair of contacts are applied usually to the same surface of the semiconductor wafer to define a gap between the contacts. The gap length is chosen to provide a hold-off voltage higher than the voltage to be switched, which is applied across the gap. This hold-off voltage is a function of the semiconductor material, its dopant and whether or not the gap surface has been passivated (or oxidized). Application of light to the gap area which is sufficiently energetic to cause the formation of charge carriers in the form of electron and hole pairs will rapidly close the switch and apply the high voltage to a load in series therewith. If the light covers the entire gap area there is no transit time limitation and the switching action is extremely fast. The switching action is accomplished with low jitter, and has the capability of high pulse repetition frequencies. Another important feature of these switches is the electrical isolation of the light signal from the switched power. One disadvantage of such an optical switch is the low current gain which results from the fact that approximately one photon of incident light is required to create one carrier pair. The present invention provides an optically activated switch of superior performance with higher current gain than prior switches of this type.

SUMMARY OF THE INVENTION

The multiple gap optically actuated switch of the present invention comprises an even number of spaced contacts arranged in a line along one of the broad faces of a bulk semiconductor wafer with a number of bridging electrodes equal to one less than said even number arranged on the opposite broad face of said wafer, with said bridging electrodes arranged to overlap pairs of said spaced contacts to form a plurality of gaps within said wafer equal to one less than the total number of said spaced contacts and said bridging electrodes. The high voltage to be switched is applied to the two end contacts on said one face of said wafer. Also, the novel switch can be alternately described as a semiconductor wafer having contacts on one broad surface thereof and bridging electrodes on the opposite broad surface arranged so that the electric field before conduction caused by high voltage applied across the end contacts on said one broad surface will produce internal electric fields which zig-zag between the spaced contacts and said bridging electrodes. This geometry directs the electric field into the bulk of the semiconductor chip where the hold-off voltage is higher than the surface hold-off voltage. Also with such a switch the surface between the contacts will remain at high resistivity even during conduction, thus preventing surface breakdown even during conduction through the bulk of the chip.

It is thus an object of this invention to provide an improved optically activated solid state switch with a high hold-off voltage, high off resistance between the contacts thereof and a short and hence low resistance conduction path, and which can be operated by a lower intensity light source than prior art switches of this type.

Another object of the invention is to provide a multiple gap optically activated switch in which the electric fields are directed into the bulk semiconductor material and in which the surface resistivity between contacts remains high both during voltage hold-off and during conduction, and wherein a control electrode can be provided.

These and other objects and advantages of the invention will become apparent from the following detailed description and the drawings.

DETAILED DESCRIPTION OF PREFERRED EMBODIMENTS

Figure 1:
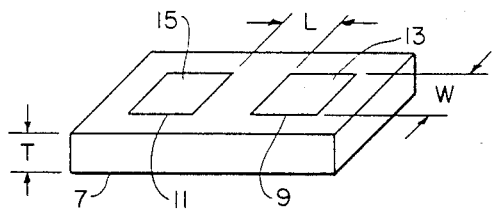
FIG. 1 is a prior art optically activated switch.

The prior art optically activated switch of FIG. 1 comprises a rectangular block of either intrinsic or doped semiconductor material 7 with two metal contacts 9 and 11 located on one of the broad faces thereof to define a gap between the contacts of length L. The contacts of this illustrative switch are square with sides of length W and thus the gap area is $L \times W$ and if L is chosen as 1 mm and W as 2 mm, the gap area will be 2 $mm^2$. The high voltage is applied to such a switch from the leads 15 and 13 connected to the contacts, as shown. The hold-off voltage of such a switch is defined as the maximum voltage which can be applied thereto without causing arcover and the resultant undesired closing of the switch. For prior switches of the type shown in FIG. 1, using a high resistivity semiconductor material in which the gap area had been passivated using the best state of the art techniques, the hold-off voltage is approximately 20 kilovolts/cm. Thus for the illustrated device of FIG. 1 with a 1 mm wide gap, the maximum hold-off voltage is approximately 2,000 volts. Further, in the device of FIG. 1 the gap area which must be illuminated by the optical source used to initiate conduction is, as stated, 2 $mm^2$. It will be apparent that with a switch such as that of FIG. 1, the electric field before conduction caused by the applied high voltage will be localized along the surface of the semiconductor in the gap area. Also, during conduction most of the load current will be confined to this same area, which can cause overheating.

It has been known in the prior art that breakdown voltages in the interior of bulk semiconductor material are several times higher than the surface breakdown voltage. This so-called bulk breakdown voltage can exceed 100 kilovolts/cm. Optically activated switches have been suggested to take advantage of this fact. Such switches have for example comprised a rectangular block of bulk semiconductor with the contacts at either end thereof, however such switches have low switching efficiency since high power light sources are required to produce the charge carrier pairs throughout the volume of the semiconductor. Also, such a switch provides a low resistivity surface path between the contacts when in the on state. The present invention provides a switch of this type which takes advantage of the high bulk breakdown or hold-off voltage but does not have the disadvantages of these prior art switches.

Figure 2:
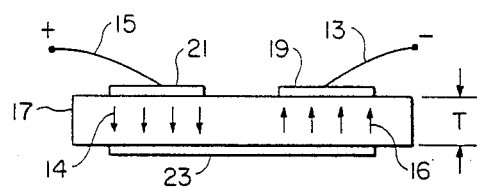
FIG. 2 is a two gap optically activated switch of the present invention.

The novel optically activated switch of FIG. 2 comprises a rectangular block of bulk semiconductor material 17, of thickness T with a pair of metal contacts 19 and 21 on one of the broad surfaces thereof. These metal contacts may be similar to those of the prior art switch of FIG. 1, with a gap of 1 mm and square with 2 mm long sides. A third metal electrode 23 is placed on the opposite broad surface of the semiconductor block so that it bridges the two upper contacts. Thus if a positive high voltage is applied to contact 21 from lead 15, with the negative high voltage terminal connected to the contact 19 via lead 13, as shown, two gaps within the semiconductor bulk material will be formed. The arrows 14 indicate the direction of the internal electric field between contact 21 and bridging electrode 23 and the arrows 16 the field between electrode 23 and contact 19. The switching light energy is applied to these two areas of overlap of the contacts and the bridging electrode to operate the switch. The light can be applied to either one side of the semiconductor block or the other, and the light wavelength and the semiconductor material are chosen so that the light energy will penetrate the entire semiconductor width which is covered by the contacts.

Assuming that the thickness T of the semiconductor block 17 of FIG. 2 is 0.4 mm, then the gap area to be illuminated by the switching light source would be this thickness multiplied by the length of each of the contacts 19 and 21, doubled. This gap area is represented in FIG. 2 by the area covered by the arrows 14 and 16. Thus the dual-gap switch of FIG. 2 has a smaller gap area, namely 0.4 mm×2. mm×2 or 1.6 mm², compared to the 2.0 mm² gap area of the prior art switch of FIG. 1. This results in a reduction of the light required for switching action. Further, the gap length of the switch of FIG. 2 is twice the wafer thickness or 0.8 mm in this example which would yield a hold-off voltage of approximately 0.8 mm × 100 kilovolts/cm. which equals 8,000 volts which is substantially more than the 2,000 volt figure for the prior art device of FIG. 1, which uses a semiconductor wafer of the same dimensions.

Figure 3:
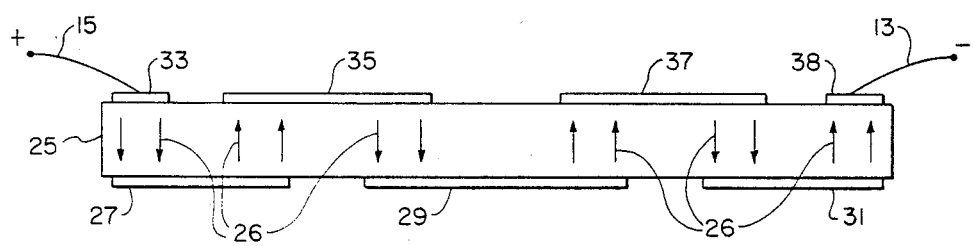
FIG. 3 is a six gap switch of this type according to the present invention.

The embodiment of the invention in FIG. 3 includes six gaps formed by four contacts 33, 35, 37 and 38 arranged in a line along one of the broad surfaces of the semiconductor wafer 25, with three bridging electrodes 27, 29, and 31 on the opposite broad surface of the wafer. The electrode 27 bridges the contacts 33 and 35 and the electrode 29 bridges contacts 35 and 37. Similarly electrode 31 bridges contacts 37 and 38. With a positive voltage applied to contact 33 from lead 15 as shown and the negative high voltage terminal connected to contact 38 via lead 13, the internal electric field lines would be as indicated by the pairs of arrows 26. This six-gap switch provides a long gap length and hence a proportionally higher hold-off voltage.

Figure 4:
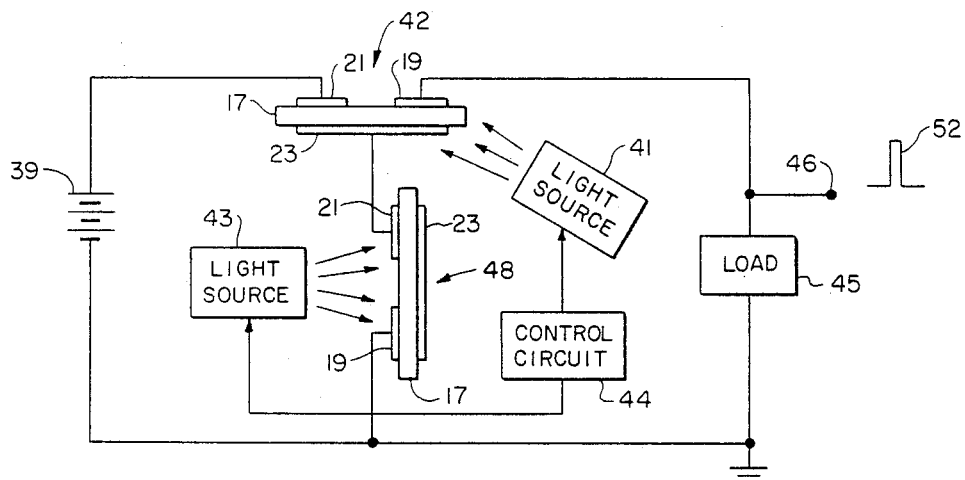
FIGS. 4 and 5 show applications of these novel switches in high voltage pulser circuits.
Figure 5:
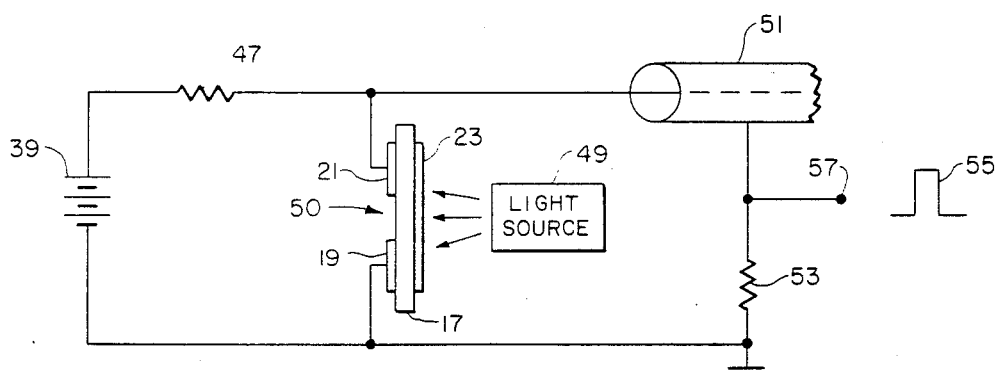

FIGS. 4 and 5 show applications of these optically activated switches in high voltage pulse forming networks which are often used in radar sets. In FIG. 4 a high voltage source 39 has its positive terminal connected to contact 21 of a first dual gap switch 42 like that of FIG. 2 and having the same reference numerals for the same parts. The other contact 19 of this first dual gap switch is connected to an output terminal 46 and one end of load 45. The other end of load 45 is grounded, as is the negative side of source 39. The bridging electrode 23 of the first switch is connected to ground through a second similar dual gap switch 48 comprising contacts 19 and 21. A light source 41 is arranged to illuminate the gaps of the first switch and light source 43 the gaps of the second switch 48. A control circuit 44 controls both of the light sources. In operation, to generate an extremely short pulse such as pulse 52 at terminal 46, the control circuit first illuminates the two gaps of the first switch. This rapidly closes the first switch and produces the leading edge of pulse 52. When it is desired to terminate the pulse, the second switch 48 is operated by light source 43 in response to a control signal from circuit 44. This grounds the bridging electrode 23 of the first switch and rapidly terminates the pulse 52. Thus by controlling the timing of the outputs of the two light sources, a pulse of any desired duration can be generated.

FIG. 5 shows a dual gap switch 50 of the present invention in a conventional pulse forming circuit including a high voltage source 39, resistor 47, energy storing co-axial line 51, load resistor 53, and output terminal 57. With the switch 50 off, the voltage source charges up the line 51 and when the switch 50 is activated by light source 49, the energy in line 51 is shorted to ground through the switch and through load resistor 53, thereby producing the output pulse 55.

While the invention has been described in connection with illustrative embodiments, obvious variations therein will occur to those skilled in the art, accordingly the invention should be limited only by the scope of the appended claims.

I claim:

1. A dual gap switch comprising:
   a semiconductor wafer with two broad substantially parallel surfaces on opposite sides thereof and connected by a narrow edge surface;
   a pair of spaced contacts located on one of said broad surfaces, said pair of contacts located to prevent surface conduction therebetween;
   a bridging electrode located on the other of said broad surfaces so that it overlaps and bridges the said two spaced contacts, whereby if a voltage is applied between said contacts a pair of gaps will be formed between each of the spaced contacts and said bridging electrode; and
   means for forming charge carriers within said gaps independently of said pair of spaced contacts, whereby the formation of said charge carriers within said gaps will rapidly reduce the resistance between said spaced contacts and said bridging electrode to close said switch.

2. A dual gap switch as in claim 1 wherein said means for forming charge carriers within said gaps comprises:
   a light source.

3. The switch of claim 2 wherein the wavelength of said light source and the material of said semiconductor and its dopant are chosen so that said light source can penetrate the entire width of said gaps.

4. An optically activated multiple gap switch comprising:
- a piece of semiconductor material having two parallel broad surfaces;
- a plurality of contacts linearly arranged along one of said broad surfaces thereof, said plurality of contacts located to prevent surface conduction therebetween;
- a plurality of bridging electrodes arranged along the opposite broad surface of said semiconductor, said contacts and electrodes being arranged so that a voltage applied between the end contacts on said one of said broad surfaces will produce multiple gaps within the bulk of said semiconductor which will zig zag between the said contacts and the said bridging electrodes, whereby said switch will have a high hold-off voltage, and a conduction path which also zig zags through said semiconductor; and
- a light source applied to one or the other of the sides of said semiconductor which connect said two broad surfaces to produce charge carriers throughout said multiple gaps, whereby a switch with a high holdoff voltage and high surface resistance between said contacts during conduction is provided.

5. The switch of claim 4 wherein the wavelength of said light source and the material of said semiconductor and its dopant are chosen so that said light source can penetrate the entire width of said gaps.

6. An optically activated multiple gap switch as in claim 4 wherein:
- the number of said plurality of contacts is ever; and
- the number of said bridging electrodes is one less than said number of said plurality of contacts.

7. A dual gap optically activated switch comprising:
- a semiconductor wafer;
- a pair of spaced contacts located on one of the broad surfaces of said wafer;
- a bridging electrode located on the opposite broad surface of said wafer so that it overlaps and bridges said two spaced contacts, said two spaced contacts forming terminals for application of a voltage to be switched;
- means for activating said switch comprising a light source arranged to illuminate the edges of said wafer which connect said two broad surfaces in the area overlapped by said bridging electrode; and
- means for controlling said bridging electrode to terminate conduction through said switch.

8. A switch comprising:
- a semiconductor wafer with two surfaces on opposite sides connected by edge surfaces;
- at least two spaced contacts located on one of said two surfaces;
- at least one bridging electrode located on the other of said two surfaces so that it overlaps and bridges said spaced contacts forming gaps between each said contact and said bridging electrode;
- means for forming charge carriers within said gaps independently of said pair of spaced contacts; and
- means for preventing surface breakdown between said contacts before bulk breakdown between said contacts and said bridging electrode upon application of a voltage difference between said contacts.

* * * * *